(12) United States Patent
Lim

(10) Patent No.: US 9,935,229 B2
(45) Date of Patent: Apr. 3, 2018

(54) SOLAR CELL AND METHOD OF FABRICATING THE SAME

(71) Applicant: LG INNOTEK CO., LTD., Seoul (KR)

(72) Inventor: Chin Woo Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 148 days.

(21) Appl. No.: 14/353,190

(22) PCT Filed: Oct. 19, 2012

(86) PCT No.: PCT/KR2012/008623
§ 371 (c)(1),
(2) Date: Apr. 21, 2014

(87) PCT Pub. No.: WO2013/058611
PCT Pub. Date: Apr. 25, 2013

(65) Prior Publication Data
US 2015/0053267 A1    Feb. 26, 2015

(30) Foreign Application Priority Data
Oct. 20, 2011   (KR) .................. 10-2011-0107470

(51) Int. Cl.
*H01L 31/0749* (2012.01)
*H01L 31/18* (2006.01)
*H01L 31/032* (2006.01)

(52) U.S. Cl.
CPC ...... *H01L 31/0749* (2013.01); *H01L 31/0322* (2013.01); *H01L 31/0324* (2013.01);
(Continued)

(58) Field of Classification Search
CPC ................ H01L 31/0324; H01L 31/0322
See application file for complete search history.

(56) References Cited

U.S. PATENT DOCUMENTS 5,948,176 A * 9/1999 Ramanathan et al. ........ 136/264
2009/0078318 A1 3/2009 Meyers et al.
(Continued)

FOREIGN PATENT DOCUMENTS

JP          06-232436 A      8/1994
JP          2011-155146 A    8/2011
KR          10-2011-0037714 A 4/2011

OTHER PUBLICATIONS

Nishiwaki, et al., Solar Energy Materials and Solar Cells, 2003, vol. 77, pp. 359-368.*
(Continued)

*Primary Examiner* — Sadie White
(74) *Attorney, Agent, or Firm* — Saliwanchik, Lloyd & Eisenschenk

(57) ABSTRACT

A solar cell according to the disclosure includes a back electrode layer; and a light absorbing layer on the back electrode layer, wherein the light absorbing layer includes an undoped region and a doping region on the undoped region, and the doping region includes zinc. A method of fabricating a solar cell according to the disclosure includes forming a back electrode layer on a substrate; forming a preliminary light absorbing layer on the back electrode layer; forming a dopant supply layer on the preliminary light absorbing layer; and diffusing the dopant supply layer.

3 Claims, 2 Drawing Sheets

(52) U.S. Cl.
CPC .......... *H01L 31/0325* (2013.01); *H01L 31/18* (2013.01); *Y02E 10/541* (2013.01)

(56) References Cited

U.S. PATENT DOCUMENTS

2010/0210065 A1* 8/2010 Aida ................. H01L 21/02568
438/95
2012/0168759 A1* 7/2012 Lee ................... H01L 27/14663
257/59

OTHER PUBLICATIONS

Miyama, et al., Phys. Status Solidi C., 2009, vol. 6, No. 5, pp. 1213-1216.*
Minemoto, et al., Thin Solid Films, 2000, vol. 372, pp. 173-176.*
International Search Report in International Application No. PCT/KR2012/008623, filed Oct. 19, 2012.
Office Action dated Apr. 28, 2016 in Chinese Application No. 201280063587.X.
Torndahl et al., "Atomic Layer Deposition of $Zn_{1-x}Mg_xO$ Buffer Layers for $Cu(In,Ga)Se_2$ Solar Cells" *Progress in Photovoltaics: Research and Applications*, 2007, pp. 225-235, vol. 15, John Wiley & Sons, Ltd.

* cited by examiner

[Fig. 1]
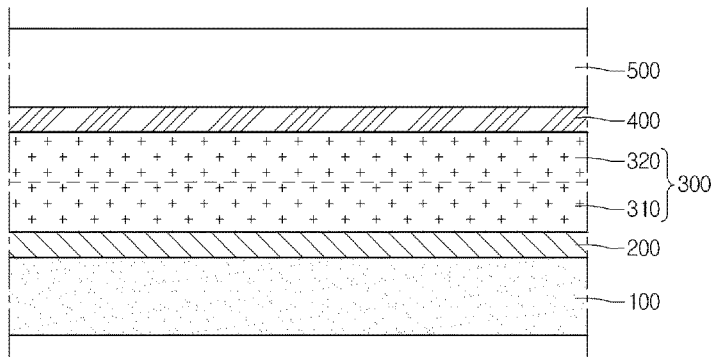
[Fig. 2]
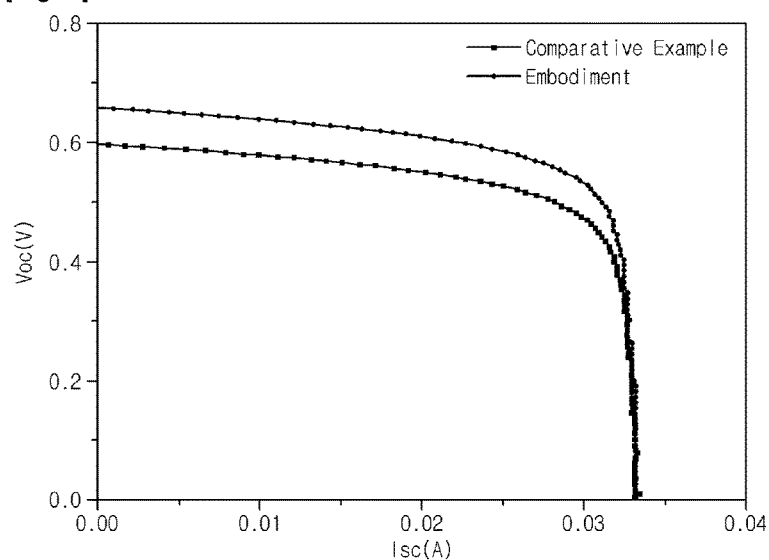
[Fig. 3]
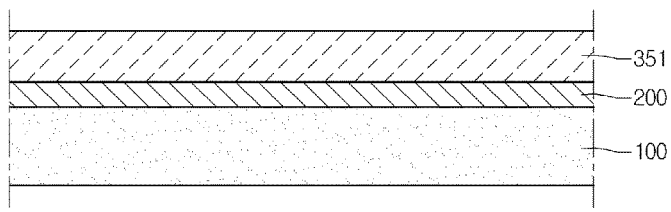
[Fig. 4]
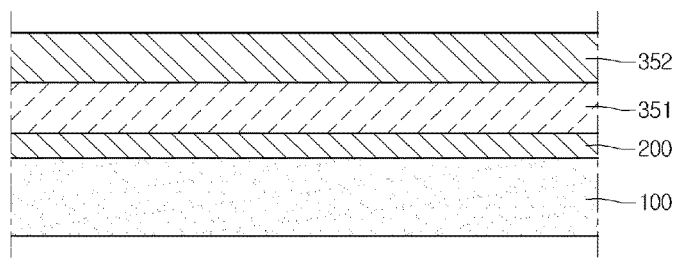

[Fig. 5]
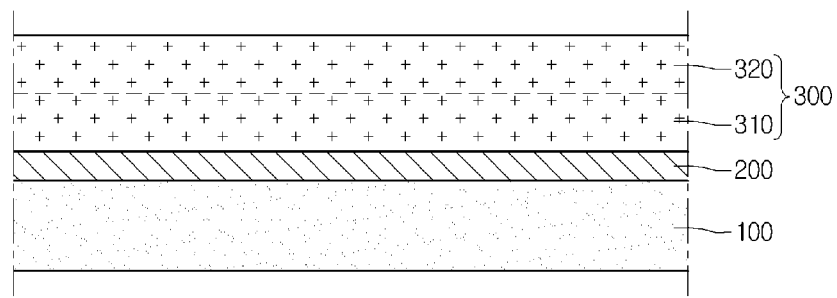
[Fig. 6]
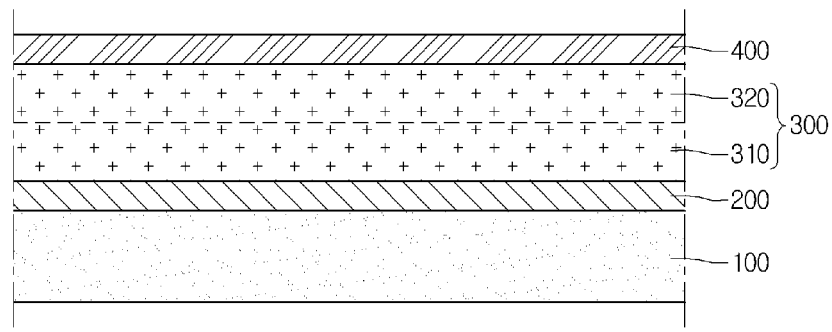

SOLAR CELL AND METHOD OF FABRICATING THE SAME

CROSS-REFERENCE TO RELATED APPLICATIONS

This application is the U.S. national stage application of International Patent Application No. PCT/KR2012/008623, filed Oct. 19, 2012, which claims priority to Korean Application No. 10-2011-0107470, filed Oct. 20, 2011, the disclosures of each of which are incorporated herein by reference in their entirety.

TECHNICAL FIELD

The embodiment relates to a solar cell and a method of fabricating the same.

BACKGROUND ART

A method of fabricating a solar cell for solar light power generation is as follows. First, after preparing a substrate, a back electrode layer is formed on the substrate and patterned by a laser, thereby forming a plurality of back electrodes.

Thereafter, a light absorbing layer, a buffer layer, and a high resistance buffer layer are sequentially formed on the back electrodes. Various schemes, such as a scheme of forming a Cu(In,Ga)Se2 (CIGS) based-light absorbing layer by simultaneously or separately evaporating Cu, In, Ga, and Se and a scheme of performing a selenization process after a metallic precursor film has been formed, have been extensively used in order to form the light absorbing layer. The energy bandgap of the light absorbing layer is in the range of about 1 eV to 1.8 eV.

Then, a buffer layer including cadmium sulfide (CdS) is formed on the light absorbing layer through a sputtering process. The energy bandgap of the buffer layer may be in the range of about 2.2 eV to 2.4 eV. After that, a high resistance buffer layer including zinc oxide (ZnO) is formed on the buffer layer through the sputtering process. The energy bandgap of the high resistance buffer layer is in the range of about 3.1 eV to about 3.3 eV.

Thereafter, a groove pattern may be formed in the light absorbing layer, the buffer layer, and the high resistance buffer layer.

Then, a transparent conductive material is laminated on the high resistance buffer layer, and is filled in the groove pattern. Therefore, a transparent electrode layer is formed on the high resistance buffer layer, and connection wires are formed in the groove pattern. A material constituting the transparent electrode layer and the connection wireless may include aluminum doped zinc oxide (AZO). The energy bandgap of the transparent electrode layer may be in the range of about 3.1 eV to about 3.3 eV.

Then, the groove pattern is formed in the transparent electrode layer, so that a plurality of solar cells may be formed. The transparent electrodes and the high resistance buffers correspond to the cells, respectively. The transparent electrodes and the high resistance buffers may be provided in the form of a stripe or a matrix.

The transparent electrodes and the back electrodes are misaligned from each other, so that the transparent electrodes are electrically connected to the back electrodes through the connection wires. Accordingly, the solar cells may be electrically connected to each other in series.

As described above, in order to convert the solar light into electrical energy, various solar cell apparatuses have been fabricated and used. One of the solar cell apparatuses is disclosed in Korean Unexamined Patent Publication No. 10-2008-0088744.

DISCLOSURE OF INVENTION

Technical Problem

The embodiment provides a solar cell capable of representing improved photoelectric conversion efficiency.

Solution to Problem

According to the embodiment, there is provided a solar cell including a back electrode layer; and a light absorbing layer on the back electrode layer, wherein the light absorbing layer includes an undoped region and a doping region on the undoped region, and the doping region includes zinc.

According to one embodiment, there is provided a method of fabricating a solar cell, including: forming a back electrode layer on a substrate; forming a preliminary light absorbing layer on the back electrode layer; forming a dopant supply layer on the preliminary light absorbing layer; and diffusing the dopant supply layer.

Advantageous Effects of Invention

The light absorbing layer included in the solar cell according to the embodiment includes a doping region and an undoped region. The doping region of the light absorbing layer forms a homogeneous PN junction together with the undoped region of the light absorbing layer so that the recombination at the interfacial surface can be reduced. Accordingly, an open-circuit voltage can be improved. The doping region and the undoped region of the light absorbing layer have energy bandgaps similar to each other so that a yield rate of electrons can be increased.

The buffer layer included in the solar cell according to the embodiment includes magnesium zinc oxide (MgZnO). Thus, the solar cell according to the embodiment may have an improved open-circuit voltage as compared with a solar cell according to the related art having the buffer layer including only cadmium sulfide.

In addition, the solar cell according the embodiment is Cd-free, so the solar cell can be fabricated through an environmental-friendly scheme without being restricted by environmental regulations.

BRIEF DESCRIPTION OF DRAWINGS

FIG. 1 is a sectional view showing one section of a solar cell according to the embodiment;

FIG. 2 is a graph comparing an open-circuit voltage Voc of the embodiment with an open-circuit voltage of a comparative example; and FIGS. 3 to 6 are sectional views showing a method of fabricating a solar cell according to the embodiment.

MODE FOR THE INVENTION

In the description of the embodiments, it will be understood that, when a layer (film), a region, a pattern or a structure is referred to as being "on" or "under" another layer (film), another region, another pattern, or another structure, it can be "directly" or "indirectly" on the other layer (film), region, pattern, or structure, or one or more intervening layers may also be present. Such a position of the layer has been described with reference to the drawings.

The size or the thickness of the layer (film), the region, the pattern or the structure may be modified exaggerated for the purpose of explanation and clarity. The size may not utterly reflect the actual size.

Hereinafter, an exemplary embodiment of the disclosure will be described with reference to the accompanying drawings.

The solar cell according to the embodiment will now be described in detail with reference to FIG. 1. FIG. 1 is a sectional view showing one section of a solar cell according to the embodiment.

Referring to FIG. 1, the solar cell according to the embodiment includes a support substrate 100, a back electrode layer 200, a light absorbing layer 300, a buffer layer 400, and a front electrode layer 500.

The support substrate 100 has a plate shape, and supports the back electrode layer 200, the light absorbing layer 300, the buffer layer 400, and the front electrode layer 500.

The support substrate 100 may include an insulator. The support substrate 100 may be a glass substrate, a plastic substrate such as polymer or a metal substrate. Meanwhile, the support substrate 100 may include soda lime glass. The support substrate 100 may be transparent, flexible or rigid.

The back electrode layer 200 is provided on a top surface of the support substrate 100. The back electrode layer 200 is a conductive layer. For example, a material used for the back electrode layer 200 may include metal such as molybdenum (Mo).

The back electrode layer 200 may include at least two layers. In this case, at least two layers may be formed by using the same metal or different metals.

The light absorbing layer 300 is provided on the back electrode layer 200. The light absorbing layer 300 may include group I-III-VI compounds. For instance, the light absorbing layer 300 may include the Cu(In,Ga)Se2 (CIGS) crystal structure, the Cu(In)Se2 crystal structure, or the Cu(Ga)Se2 crystal structure.

At least a part of the light absorbing layer 300 is doped with zinc (Zn). In detail, the light absorbing layer 300 includes an undoped region 310 and a doping region 320, and the doping region 320 includes zinc (Zn). In this case, the zinc (Zn) may be contained in the amount of 0.1 wt % to 3 wt %.

A thickness of the undoped region 310 may be less than 50% based on a thickness of the doping region 320.

The energy bandgap of the light absorbing layer 300 is in the range of about 1 eV to 1.8 eV.

In the embodiment, because the undoped region 310 of the light absorbing layer 300 forms a homogeneous PN junction together with the doping region 320 of the light absorbing layer 300, the recombination at the interfacial surface can be reduced so that the open-circuit voltage can be improved. The energy bandgap of the undoped region 310 of the light absorbing layer 300 is similar to the energy bandgap of the doping region 320 of the light absorbing layer 300 so that a yield rate of electrons can be increased.

The buffer layer 400 is provided on the light absorbing layer 300. The buffer layer 400 directly makes contact with the light absorbing layer 300.

The buffer layer 400 may include magnesium zinc oxide (MgZnO).

The magnesium zinc oxide (MgZnO) is expressed as following chemical formula, (Mg$_x$Zn$_{1-x}$)O                    Chemical formula wherein the x satisfies a following equation 1.

0.3 ≤ x ≤ 0.7                    Equation 1

Meanwhile, a mass ratio of the magnesium zinc oxide (MgZnO) may satisfy a following equation 2.

Mg/Zn ≤ 0.7                    Equation 2

Referring to FIG. 2, the solar cell according to the embodiment has an improved open-circuit voltage Voc as compared with the solar cell according to the related art having the buffer layer including only cadmium sulfide, which will be described later.

The solar cell according the embodiment is Cd-free, so the solar cell can be fabricated through an environmental-friendly scheme without being restricted by environmental regulations.

The front electrode layer 500 is provided on the light absorbing layer 300. In detail, the front electrode layer 500 is provided on the buffer layer 400.

The front electrode layer 500 is provided on the buffer layer 400 and is transparent.

For example, a material used for the front electrode layer 500 may include an Al doped zinc oxide (AZO), an indium zinc oxide (IZO), or an indium tin oxide (ITO).

A thickness of the front electrode layer 500 may be in the range of about 500 nm to about 1.5 μm. The front electrode layer 500 includes the AZO, the aluminum (Al) may be doped at the amount of about 1.5 wt % to about 3.5 wt %. The front electrode layer 500 is a conductive layer.

Hereinafter, a method of fabricating the solar cell according to the embodiment will be described with reference to FIGS. 3 to 6. In the following description, the details of structures and components similar to or the same as those described above will be omitted for the purpose of clarity and simple explanation.

FIGS. 3 to 6 are sectional views showing a method of fabricating a solar cell according to the embodiment.

The method of fabricating a solar cell according to the embodiment may include a step of forming a back electrode layer 200, a step of forming a preliminary light absorbing layer 351, a step of forming a dopant supply layer 352, and a step of forming a light absorbing layer.

First, referring to FIG. 3, metal such as molybdenum (Mo) is deposited on a support substrate 100 and a back electrode layer 200 is formed. The back electrode layer 200 may be formed by two processes having different process conditions.

An additional layer such as a diffusion prevention layer may be interposed between the support substrate 100 and the back electrode layer 200.

Then, a preliminary light absorbing layer 351 is formed on the back electrode layer 200. The preliminary light absorbing layer 351 may have a Cu—In—Ga—Se-based structure. For instance, Cu, In, Ga and Se are simultaneously or independently evaporated to form the CIGS-based preliminary light absorbing layer 351, or the preliminary light absorbing layer 351 can be formed through the selenization process after forming a metal precursor layer.

In detail, the metal precursor layer is formed on the back electrode layer 200 by performing the sputtering process using a Cu target, an In target, and a Ga target.

Then, the selenization process is performed to form the CIGS-based preliminary light absorbing layer 351.

In addition, the sputtering process using the Cu target, the In target, and the Ga target and the selenization process can be simultaneously performed.

After that, referring to FIG. 4, a dopant supply layer 352 may be formed on the preliminary light absorbing layer 351. The dopant supply layer 352 includes zinc compound. In detail, the dopant supply layer 352 may include dimethyl-zinc ((CH3)2Zn). The dopant supply layer 352 may be deposited through inert carrier gas.

Next, referring to FIG. 5, a step of forming the light absorbing layer 300 is performed. In the step of forming the light absorbing layer 300, the light absorbing layer 300 may be formed by diffusing the dopant supply layer 352. In detail, the dopant supply layer 352 may be diffused into the preliminary light absorbing layer 351.

The step of forming the light absorbing layer 300 may be performed at the temperature equal to or lower than 350° C.

The step of forming the light absorbing layer 300 may be performed for a time equal to or less than 600 minutes. Accordingly, the above doping region 320 may be ensured by preventing zinc (Zn) contained in the dopant supply layer 352 from reaching a bottom surface of the preliminary light absorbing layer 351.

Referring to FIG. 6, after forming the light absorbing layer 300, a step of forming the buffer layer 400 may be performed. The buffer layer 400 may be formed by depositing the magnesium zinc oxide through Physical Vapor Deposition (PVD).

The front electrode layer 500 is deposited on the buffer layer 400.

For example, the front electrode layer 500 may be formed by depositing a transparent conductive material such as AZO on a top surface of the buffer layer 400 through a sputtering process.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

EXPERIMENTAL EXAMPLE

A sputtering process was performed to deposit molybdenum (Mo) on a soda lime glass substrate at a thickness of about 1 μm. Next, CuIn0.3Ga0.7Se2 was deposited on the back electrode layer at a thickness of about 1 μm through an evaporation so that a light absorbing layer was formed. After that, the sputtering process was performed to deposit MgZnO on the light absorbing layer at a thickness of about 50 nm so that a buffer layer was formed. Subsequently, zinc oxide (ZnO) without impurities was deposited on the buffer layer at a thickness of about 70 nm so that a high resistance buffer layer was formed. After that, the sputtering process was performed to form a front electrode layer on the high resistance buffer layer using a zinc oxide target which is doped with about 3 wt % of aluminum.

COMPARATIVE EXAMPLE

Similar to the experimental example, after a light absorbing layer was formed, CdS was deposited on the light absorbing layer at a thickness of about 70 nm through chemical bath deposition (CBD). After that, similar to the experimental example, a high resistance buffer layer and a front electrode layer were formed.

Referring to FIG. 2, an open-circuit voltage Voc according to a solar cell of the experimental example can be improved as compared with a solar cell of the comparative example.

The invention claimed is:

1. A solar cell comprising:
a support substrate;
a back electrode layer on the support substrate;
a light absorbing layer on the back electrode layer;
a buffer layer on the light absorbing layer;
a high resistance buffer layer comprising ZnO, without impurities, and disposed on the buffer layer; and
a front electrode layer on the high resistance buffer,
wherein the light absorbing includes a $Cu(Ga,In)Se_2$ (CIGS) crystal structure,
wherein the front electrode layer has a thickness in a range of from 500 nm to 1.5 μm,
wherein the front electrode layer is doped with 1.5 wt % to 3.5 wt % aluminum (Al),
wherein the buffer layer comprises magnesium zinc oxide (MgZnO) and a mass ratio of the Mg to Zn in the magnesium zinc oxide is less than or equal to 0.7,
wherein the light absorbing layer includes an undoped region and a doping region on the undoped region,
wherein the undoped region is disposed on and in direct contact with the back electrode layer,
wherein the doping region is disposed on the undoped region,
wherein the doping region is in direct contact with the buffer layer,
wherein a thickness of the undoped region is less than 50% of a thickness of the doping region,
wherein the doping region comprises zinc,
wherein an amount of the zinc in the doping region is in a range of 0.1 wt % to 3 wt %; and
wherein the doping region of the light absorbing layer forms a homogenous PN junction together with the undoped region of the light absorbing layer, and wherein the doping region has an energy bandgap similar to that of the undoped region.

2. The solar cell of claim 1, wherein the magnesium zinc oxide (MgZnO) is expressed by a chemical formula $(Mg_xZn_{1-x})O$.

3. The solar cell of claim 2, wherein the x satisfies an equation $0.3 \leq x \leq 0.7$.

* * * * *